United States Patent
Scherer (10) Patent No.: US 9,983,333 B2
(45) Date of Patent: May 29, 2018

(54) HAFNIUM OR ZIRCONIUM OXIDE COATING

(71) Applicant: LEYBOLD OPTICS GMBH, Alzenau (DE)

(72) Inventor: Michael Scherer, Kahl (DE)

(73) Assignee: Leybold Optics GmbH, Alzenau (DE)

( * ) Notice: Subject to any disclaimer, the term of this patent is extended or adjusted under 35 U.S.C. 154(b) by 0 days. days.

(21) Appl. No.: 14/744,138

(22) Filed: Jun. 19, 2015

(65) Prior Publication Data

US 2015/0285957 A1 Oct. 8, 2015

Related U.S. Application Data (63) Continuation of application No. 12/620,585, filed on Nov. 17, 2009, now abandoned, which is a continuation of application No. PCT/EP2008/009206, filed on Oct. 31, 2008, and a continuation of application No. PCT/EP2009/002138, filed on Mar. 24, 2009.

(60) Provisional application No. 61/115,187, filed on Nov. 17, 2008, provisional application No. 61/162,846, filed on Mar. 24, 2009.

(51) Int. Cl.
| | | |
|---|---|---|
| *C09D 1/00* | (2006.01) | |
| *G02B 1/115* | (2015.01) | |
| *C04B 35/48* | (2006.01) | |
| *C04B 35/622* | (2006.01) | |
| *C23C 14/08* | (2006.01) | |
| *C23C 14/35* | (2006.01) | |

(52) U.S. Cl.
CPC ............ *G02B 1/115* (2013.01); *C04B 35/481* (2013.01); *C04B 35/62222* (2013.01); *C09D 1/00* (2013.01); *C23C 14/08* (2013.01); *C23C 14/083* (2013.01); *C23C 14/354* (2013.01)

(58) Field of Classification Search
CPC ......... C09D 1/00; C23C 14/08; C23C 14/083; C04B 35/481; C04B 35/62222
USPC .................................................. 106/287.19
See application file for complete search history.

(56) References Cited

U.S. PATENT DOCUMENTS

| | | | | |
|---|---|---|---|---|
| 5,514,485 A | * | 5/1996 | Ando | ................ B32B 17/10174 428/446 |
| 6,413,386 B1 | | 7/2002 | Callegari et al. | |
| 2005/0160981 A9 | | 7/2005 | Vaartstra | |
| 2006/0208215 A1 | | 9/2006 | Metzner et al. | |
| 2010/0279124 A1 | * | 11/2010 | Scherer | .................... C09D 1/00 428/432 |

FOREIGN PATENT DOCUMENTS

| | | |
|---|---|---|
| JP | 03-187733 | 8/1991 |
| JP | 04-291981 | 10/1992 |
| JP | 2003-177234 | 6/2003 |
| JP | 2007-299878 | 11/2007 |
| JP | 2011-533551 | 3/2012 |
| KR | 10-2005-0042171 | 5/2005 |
| KR | 10-2005-0042171 A | 5/2005 |
| KR | 10-2005-0114271 | 12/2005 |
| KR | 10-2005-0114271 A | 12/2005 |

OTHER PUBLICATIONS

Abrisa, "Physical Vapor Deposition—Sputtering vs. Electron Beam Evaporation", Ace Perez (Aug. 2012).*
Korean Official Action (dated Sep. 8, 2015) (translation) from corresponding Korean App. 10-2011-7012503.
R.B. Tokas [et al.], A comparative morphological study of electron beam codeposited binary optical thin films of HfO2:SiO2 and ZrO2:SiO2, Current Applied Physics, 2008, vol. 8, issue. 5, p. 589-602.
Japanese Official Action (translation) (dated Aug. 17, 2015) for corresponding Japanese Application 2014-182334.
Korean Official Action (dated Oct. 12, 2016) (translation) for corresponding Korean Patent Application No. 10-2016-7020033.

* cited by examiner

*Primary Examiner* — David M Brunsman
(74) *Attorney, Agent, or Firm* — WRB-IP LLP (57) ABSTRACT

The invention concerns an optical coating (3, 3'), having a high refractive index and good optical properties (i.e., low absorption and scatter) and limited internal stresses in a spectral range extending from the visible to the near UV range (i.e., up to a wavelength of 220 nm). The coating (3, 3') according to the invention consists of a hafnium- or zirconium-containing oxide $Hf_xSi_yO_z$ or $Zr_xSi_yO_z$ containing an silicon fraction (y) between 1 at. % and 10 at. %, especially between 1.5 at. % and 3 at. %.

11 Claims, 6 Drawing Sheets

HAFNIUM OR ZIRCONIUM OXIDE COATING

CROSS REFERENCE TO RELATED APPLICATIONS

This application is a continuation of U.S. application Ser. No. 12/620,585, filed Nov. 17, 2009, now abandoned, which is related to and claims the benefit of U.S. Provisional Patent Application Ser. No. 61/115,187 filed on 17 Nov. 2008 and U.S. Provisional Patent Application Ser. No. 61/162,846 filed on 24 Mar. 2009. Furthermore, this application is a continuation of International Patent Application Number PCT/EP08/009206 filed on 31 Oct. 2008, and is a continuation of International Patent Application Number PCT/EP09/002138 filed on 24 Mar. 2009. All of said applications are herein incorporated by reference in their entirety.

The invention concerns a coating of hafnium- or zirconium-containing oxide according to the preamble of Claim 1. The invention also concerns an optical component with a coating from a hafnium- or zirconium-containing oxide and a method for production of a coating or optical component.

The use of hafnium oxide or zirconium oxide as a coating material for optical elements is known. Hafnium oxide is characterized relative to other coating materials by a high refractive index in the visible spectral range (n=2.08 at X=550 nm) and in the UV range (n=2.35 at X=250 nm) and a high transparency, both in the visible and UV range (absorption edge at X=220 nm). Hafnium oxide is therefore particularly suited for use as a coating material for optical components with low reflection and a high transparency and for mirrors, for example, for laser mirrors. The same applies to zirconium oxide.

It is known to produce hafnium oxide or zirconium oxide coatings by means of ion beam sputtering. Qualitatively high-grade coatings with low absorption and scattering can be produced with this method, but deposition only occurs with comparatively low epitaxial growth rates of <0.1 nm/s. The coatings deposited with ion beam sputtering also have high internal stresses (>1000 MPa). It is also known to deposit hafnium oxide and zirconium oxide layers by magnetron sputtering. This method does permit high epitaxial growth rates of >0.4 nm/s, but the generated layers exhibit only moderate quality relative to absorption and scattering, and also have high internal stresses between 1000 and 2000 MPa.

Both methods therefore yield layers with high internal stresses. The forces produced by such high internal stresses (depending on the substrate material) lead to deformations of the substrate surfaces and therefore an adverse effect on optical properties of the coated optical elements. High internal stresses can also result in layer detachments with or without damage to the substrate material.

An amorphous oxide film, containing silicon and at least one member of the group Zr, Ti, Hf, Sn, Ta and In, is known from DE 689 28 474 T2. Such an oxide film is supposed to have excellent scratch resistance, abrasion resistance and chemical durability. It is applied as such to objects, in which high lifetime is required, for example, as a protective layer, on glass that shields heat radiation. It can also be used as a diffusion barrier in a laminated glass. The applications described in DE 689 28 474 T2 therefore pertain to layers that are supposed to have high transparency in the visible range; properties in the UV range are not mentioned in this document.

The underlying task of the invention is to furnish an optical coating that has the highest possible refractive index in a spectral range extending from the visible to the near UV range (i.e., to a wavelength of 230 nm) and good optical properties (especially low absorption and scatter) and the lowest possible internal stresses. Another underlying task of the invention is to provide such coatings and optical components with a coating and propose a method for their production. The task is solved by the features of the independent claims. Advantageous embodiments are the object of dependent claims.

Only the coating according to the invention with hafnium oxide and a mixture of silicon ($Hf_xSi_yO_z$) is taken up below. For coatings with zirconium oxide and a mixture of silicon ($Zr_xSi_yO_z$), the same applies, unless otherwise stated.

The coating consists of hafnium oxide with an admixture of silicon in an amount of 1 at. % to 10 at. %, at. % referring to a fraction of an amount of an element as an atomic percentage of the total amount. Hafnium oxide has a high refractive index of n>2 in the visible to the near infrared spectral range. Admixture of silicon reduces the refractive index, for which reason this limited amount should be reduced.

However, it is surprisingly found that this limited admixture of silicon is already sufficient to substantially reduce the internal stresses of the coating. The coating preferably has an O fraction (z) lying between 65 at. % and 68 at. %, so that this coating has only limited optical losses into the UV range.

It was also found that by limited admixture of silicon, the optical properties of the hafnium oxide layer can be improved: at a silicon content between 1 at. % and 3 at. %, the $Hf_xSi_yO_z$ layer has lower absorption than pure hafnium oxide.

The coating according to the invention preferably has an internal layer stress (compressive stress) between 100 MPa and 800 MPa, in which the refractive index is preferably greater than 1.9 at a wavelength of 550 nm and/or the extinction has a value $K<3*10^{-3}$ at a wavelength of 242 nm, the Si content preferably lying between 1 at. % and 10 at. %. The internal layer stress is preferably less than 300 MPa.

The extinction K is given here under the following relations:

$$A=1-T-R$$

$$K=(-X/4\pi rd)*\ln(1-A)$$

in which A is the degree of absorption, T the degree of transmission and R the degree of reflection.

The $Hf_xSi_yO_z$ coating according to the invention is produced by sputtering, especially DC or medium frequency magnetron sputtering. By adjusting the process parameters, high sputtering rates can be achieved and the internal stresses of the sputtered layer can be substantially reduced relative to those of pure hafnium oxide via the silicon content. Preparation of the $Hf_xSi_yO_z$ layer advantageously occurs by reactive co-magnetron sputtering of Hf and Si targets; as an alternative, co-sputtering targets of HfSi or $Hf_xSi_yO_z$ and Si can be used. The $Hf_xSi_yO_z$ layer can also be generated by reactive magnetron sputtering of a compound target containing Hf and Si in an appropriate composition. Layer production by partially reactive magnetron sputtering, using a conducting $Hf_xSi_yO_z$ compound target, is also conceivable. It is particularly advantageous, if the reactive or partially reactive medium frequency magnetron sputtering is combined with reactive in situ plasma treatment, as described in PCT/EP 2003/1013649, and which is included in this application by reference. The method described in PCT/EP 2003/013649 permits, in particular, deposition of layers with an O fraction (z) between 65 at. % and 66 at. % and therefore having only slight optical losses into the UV range.

The coating according to the invention can be present in amorphous, micro- or nanocrystalline form, or a mixed form between the mentioned forms.

The coating according to the invention is particularly suited for use in multilayer systems, in which at least hafnium oxide is present, for example, for laser mirrors, edge filters and for UV transparent or reflecting filters, especially for a spectral range up to a limit of 220 nm.

The invention is further explained below with reference to a practical example depicted in the figures. In the figures.

Figure 1A:
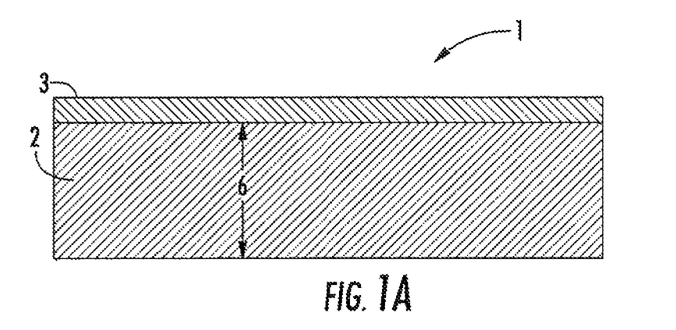
FIG. 1a shows a schematic view of a substrate with an $Hf_xSi_yO_z$ coating.

FIG. 1a shows a section of an optical component 1 with a substrate 2, on which a coating 3 of $Hf_xSi_yO_z$ according to the invention is applied. The thickness of the coating 3 is then shown strongly exaggerated relative to thickness 6 of substrate 2. The substrate 2 consists of a quartz, glass or plastic. Component 1 is a filter, which is supposed to have the lowest possible absorption in a stipulated spectral range. The spectral range considered here extends from visible light to UV radiation with a wavelength of about 230 nm.

Figure 2A:
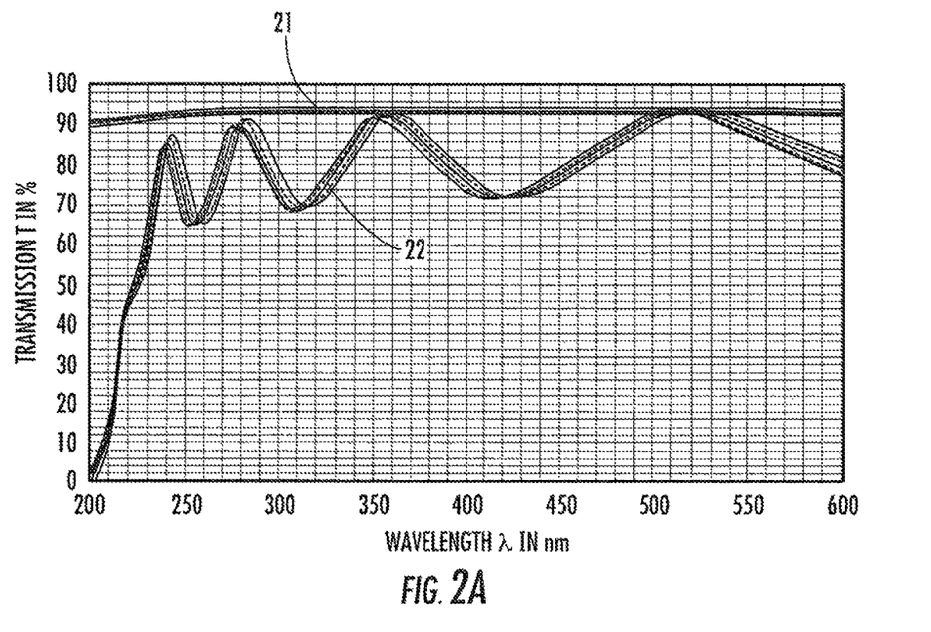
FIG. 2a shows a view of transmission of uncoated quartz substrates and substrates coated with $HfO_2$ layers in the spectral range from 200 nm to 600 nm.

It is known that individual layers or multilayer systems based on hafnium dioxide ($HfO_2$) are particularly suited for such applications, since this material has low absorption in a spectral range from the visible to 220 nm. FIG. 2a shows a graphic plot of transmission of uncoated quartz substrates and those coated with $HfO_2$ layers, which were applied by reactive magnetron sputtering with different process parameters (pressure, plasma energy, etc.) on substrate 2. The uncoated quartz substrates over the entire considered spectral range show a transmission of greater than 90% (curve 21). The quartz substrates coated with $HfO_2$ layers show in the considered spectral range moderate absorption with an absorption edge (T=50%) of about 220 nm (curve 22).

Figure 3:
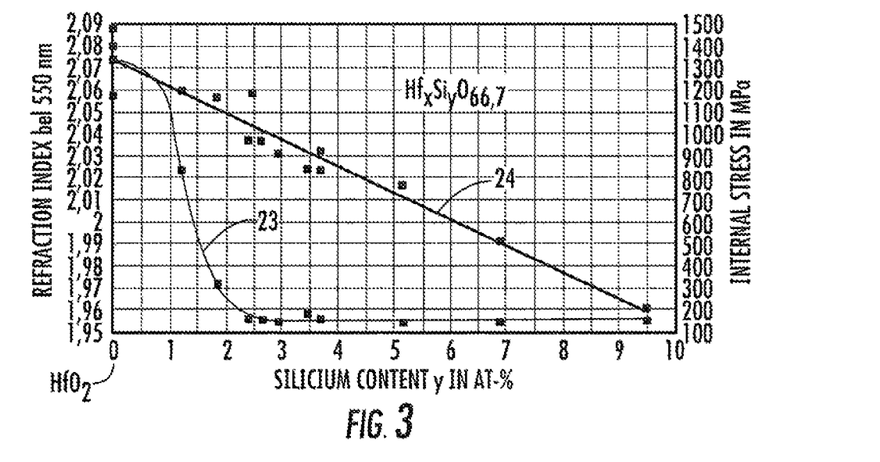
FIG. 3 shows measured values of the refractive index n at 550 nm and the internal stresses of an $Hf_xSi_yO_{66.7}$ layer as a function of silicon content y.

However, the internal stress of an $HfO_2$ coating 3 with 1000 MPa 1500 MPa is very high: as shown in FIG. 3, in a coating of pure $HfO_2$, internal stresses of 1300-1400 MPa are measured. Such high internal stresses of coating 3 exert high forces on the underlying substrate 2, which can lead to deformations of substrate 2 and/or layer detachment.

The internal stresses of coating 3 can be reduced, if the hafnium of the $HfO_2$ coating is replaced partly by silicon: as is apparent from the measured values and the regression curve 23 in FIG. 3, the internal stress of an $Hf_xSi_yO_{66.7}$ coating 3 at a silicon fraction of y~1.5 at. % is only about 500 MPa, and a silicon fraction of y~2.5 at. % of the internal stress has dropped even to below 200 MPa.

The measurements of internal stresses ($stress_{Ufilm}$) of coating 3 occurred with a measurement system SIG-500SP from the company sigma-physik (D-37115 Duderstadt), using the Stoney formula (1909).

$$\sigma_{film} = \frac{(X_{after} - X_{before})}{12La} \cdot \frac{E_{substrate}}{1 - v_{substrate}} \cdot \frac{d^2_{substrate}}{d_{film}}$$

| | |
|---|---|
| Esubstrate | Young's modulus substrate |
| vsubstrate | Poisson ratio substrate |
| dsubstrate | Substrate thickness |
| dfilm | Layer thickness |
| L | Layer detector spacing |
| a | Laser beam spacing |

Monocrystalline silicon wafers 3" in diameter and 380 gm thick, polished on one side, were used as substrate material. These wafers are suitable because of their very limited roughness of 0.1 nm and very homogeneous surface for stress measurement. Uncoated wafers were first measured. For this purpose, the wafer was placed on the sample holder in precisely defined alignment and the spacing of the two laser beams was measured 5 times in succession on the detector ($X_{before}$) and stored under the sample number. The individual already measured silicon wafers were then coated with $Hf_xSi_yO_z$ layers of different composition. The layer thickness was chosen at about 250 nm to increase the measurement accuracy. The precise layer thicknesses were determined with a spectral ellipsometer. The individual coated wafers were then placed in the same alignment on the sample holder and the spacing of the two laser beams measured 5 times in succession on the detector ($X_{after}$), and also stored under the corresponding sample number. The stresses of the individual coatings were determined with the Stoney formula from the two measurements.

Figure 4:
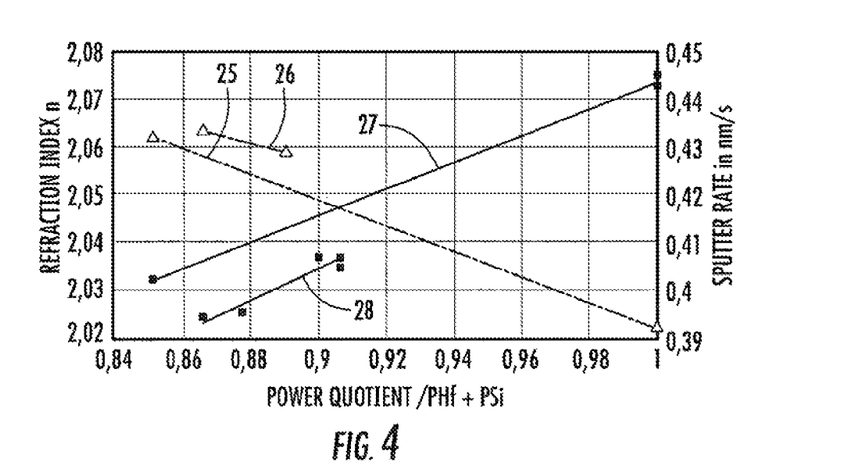
FIG. 4 shows measured values of the refractive index n at 550 nm and the epitaxial growth rates during reactive magnetron sputtering of $Hf_xSi_yO_{66.7}$ layers as a function of power ratio PHf/(PHf+PSi)

The generation of such $Hf_xSi_yO_{66.7}$ coatings 3 can occur, in particular, by reactive co-magnetron sputtering of Hf and Si targets, in which, with appropriate choice of process parameters, high sputtering rates can be achieved. It is apparent from FIG. 4 that admixture of silicon even has a positive effect on the epitaxial growth rate; curves 25 and 26 show epitaxial growth rates during use of different sputtering parameters. By partial replacement of Hf with Si in $Hf_xSi_yO_{66.7}$, the internal stresses of coating 3 can therefore be reduced at high sputtering rates. However, with increasing silicon fraction y, the refractive index n of the $Hf_xSi_yO_{66.7}$ coating 3 diminishes (see regression line 24 in FIG. 3 and regression lines 27, 28 in FIG. 4, which show the refractive index n as a function of Si content y at a wavelength X=550 nm). To achieve a high refractive index, the silicon fraction y should therefore be as low as possible. These opposite requirements can be satisfied, if the silicon fraction y is set between 1 at. % and 10 at. %.

Figure 5:
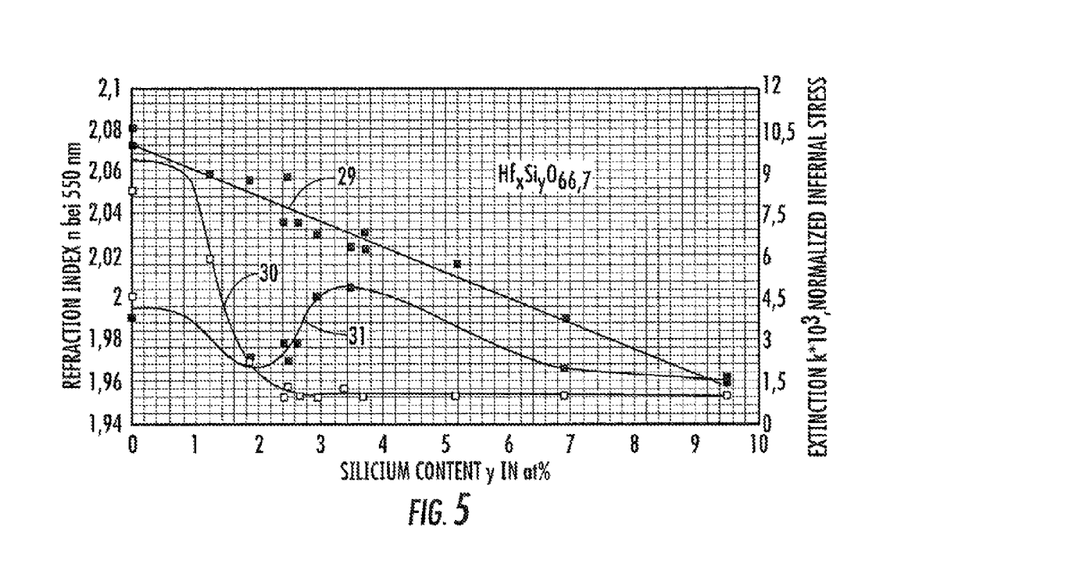
FIG. 5 shows measured values of the refractive index n at 550 nm, the extinction at 242 nm and the normalized internal stresses of $Hf_xSi_yO_{66.7}$ layers as a function of silicon content y.
Figure 6:
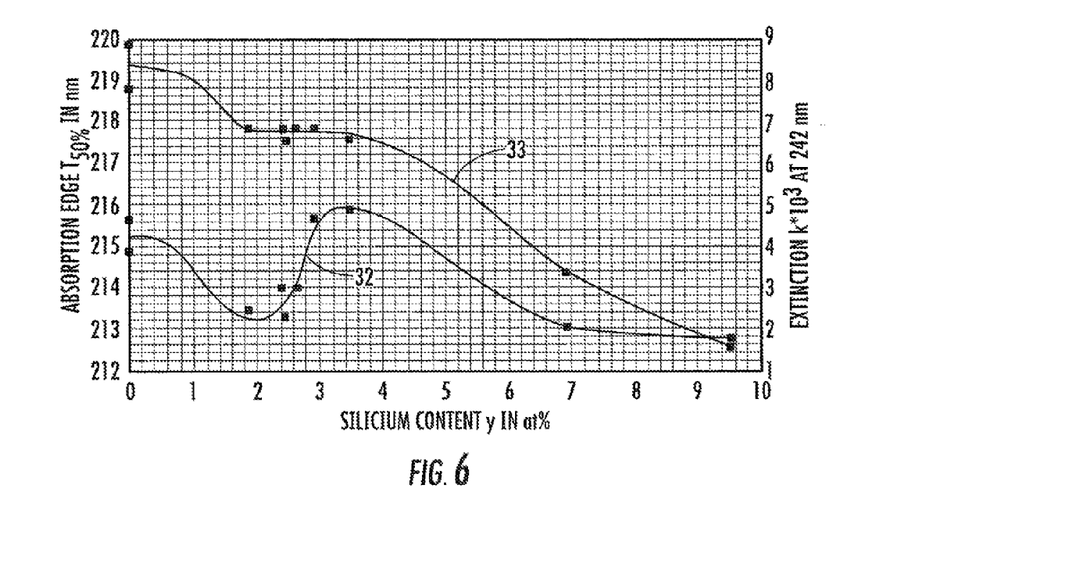
FIG. 6 shows measured values of extinction at 242 nm and the absorption edge of $Hf_xSi_yO_{66.7}$ layers as a function of sodium content y.

A particularly favorable Si concentration range lies between about y=1.5 at. % and y=3 at. % (see FIG. 5). As is apparent from the trend of the regression line 29 of the measured values of refractive index n=550 nm, the refractive index n is comparably large at about 2.05 in this Si concentration range. At the same time, the internal stresses (regression curve 30 in FIG. 5 and regression curve 23 in FIG. 3) in this Si concentration range have already dropped to values below 500 MPa. In this Si concentration range, the optical properties of the $Hf_xSi_yO_{66.7}$ coating 3 are also particularly favorable, since a local maximum of extinction is present there, measured at the UV wavelength of 242 nm (regression curve 31 in FIG. 5 and regression curve 32 in FIG. 6). A corresponding dependence of extinction of the Si concentration is found at wavelengths up to the corresponding absorption edge.

Figure 2B:
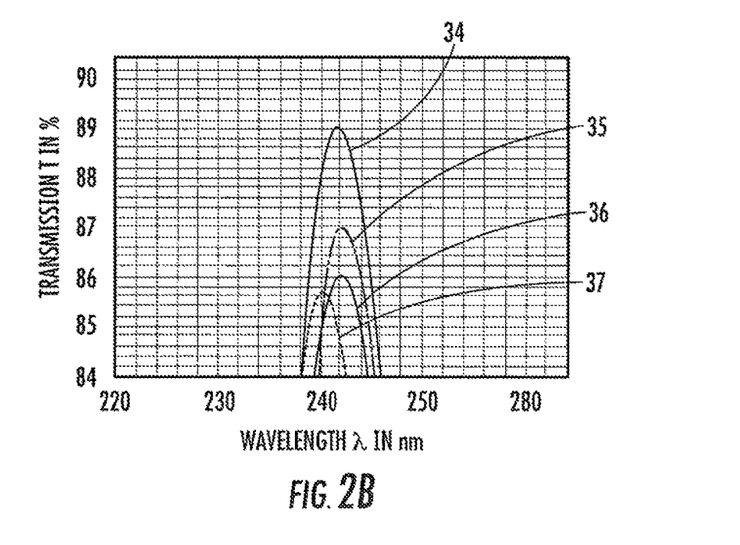
FIG. 2b shows a view of the transmission of an $Hf_{30.8}Si_{2.5}O_{66.7}$ layer and several $HfO_2$ layers on a quartz substrate in the spectral range from 220 nm to 260 nm.

In the Si concentration range 1.5 at. %<y<3 at. %, the absorption edge is also almost constant and only slightly shifted relative to the absorption edge of pure $HfO_2$ (i.e., y=0) (see regression curve 33 in FIG. 6); this indicates that the layer structure in the Si concentration range 1.5 at. %<y<3 at. % is $HfO_2$-dominated. As shown in the detail view of FIG. 2b, co-sputtering of silicon also increases the transmission of the $Hf_xSi_yO_{66.7}$ layer: in the depicted spectral range, the measured transmission of a sample with a silicon content of y=2.5 at. % (curve 34) is higher than the layers of pure $HfO_2$ prepared with difference process parameters (curves 35-37). With an increase in Si concentration (y>5 at. %), an $HfO_2$—$SiO_2$ mixed oxide is increasingly formed, with a distinct shift in absorption edge into the shortwave spectral range (regression curve 33 in FIG. 6), with diminishing extinction at 242 nm (regression curves 31 and 32 in FIG. 5 and FIG. 6), as well as a continuous reduction of refractive index n (regression line 29 in FIG. 5).

The coating 3 according to the invention is produced by reactive co-magnetron sputtering of Hf and Si targets. During reactive co-magnetron sputtering, targets of HfSi or $Hf_xSi_yO_z$ and Si can also be used. The $Hf_xSi_yO_{66.7}$ coating 3 can also be produced by other methods, for example, by using HfSi compound targets of appropriate composition. The layer can also be produced by partially reactive magnetron sputtering of a DC-conducting $Hf_xSi_yO_z$ target. Finally, layer production by one of the mentioned methods can be combined with reactive in situ plasma treatment.

Figure 7:
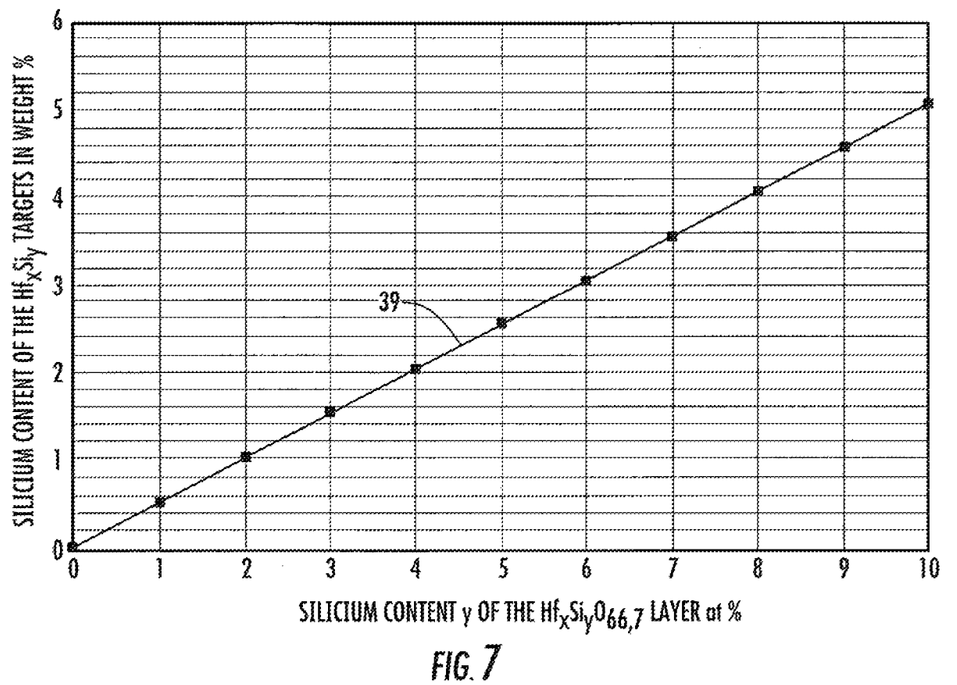
FIG. 7 shows a graphic depiction of the relation between silicon content y of the $Hf_xSi_yO_z$ layer and the corresponding silicon content of an HfSi-mixed target.
Figure 8:
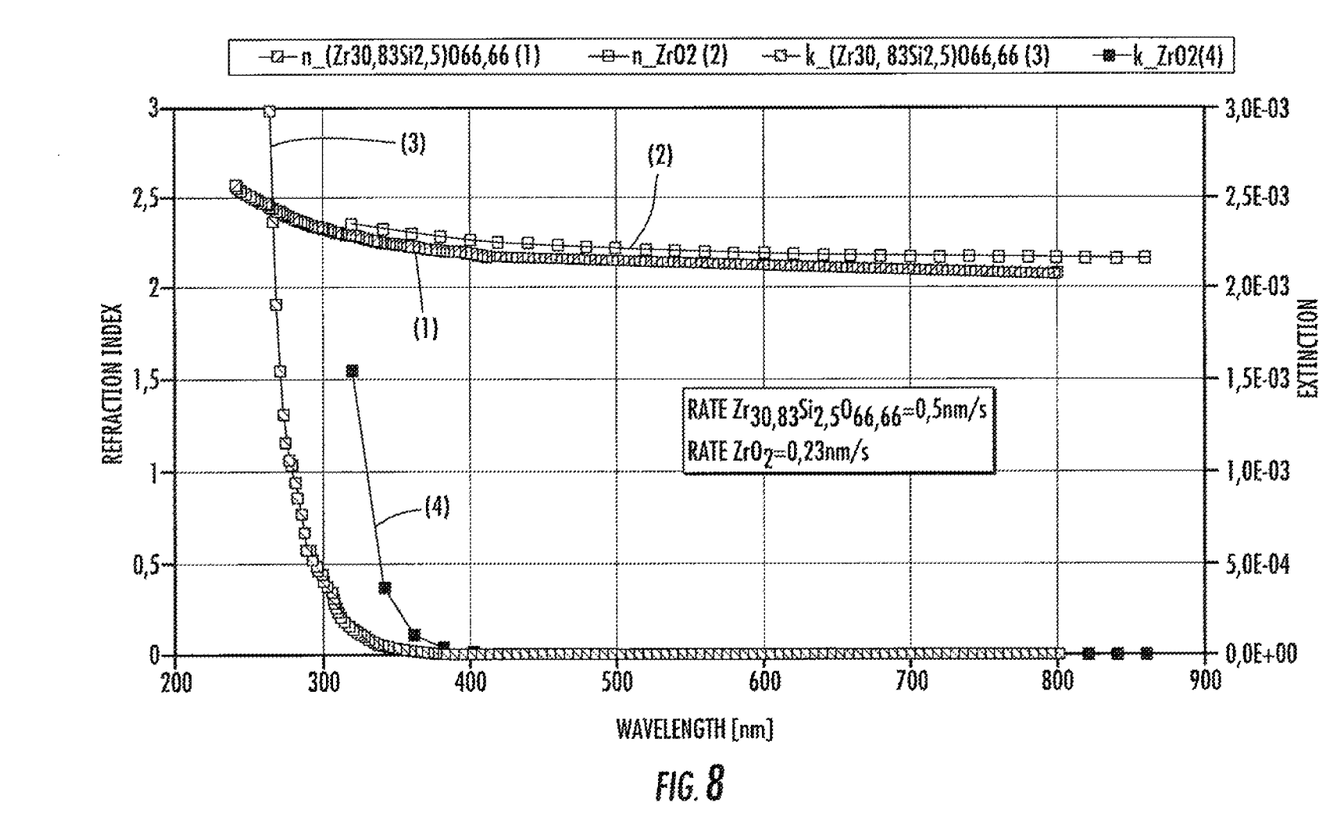
FIG. 8 shows measured values of the refractive index n and the extinction k of a $Zr_xSi_yO_{66.66}$ layer and a $ZrO_2$ layer as a function of wavelength.

The use of HfSi or $Hf_xSi_yO_z$ compound targets, whose Si content is set so that the sputtered layer has minimal extinction with simultaneously low internal stress and high refractive index, is particularly advantageous. With such targets, different requirements can be optimized by co-magnetron sputtering with Si with the advantage of lower internal stresses of the layer growing on the HfSi or $Hf_xSi_yO_z$ cathode environment, which significantly reduces the probability of particle loading. FIG. 7 shows the relation between silicon content y of the $Hf_xSi_yO_z$ layer in at. % and the corresponding silicon content of an HfSi mixed target in weight % (line 39). For the preferred Si content y of the $Hf_xSi_yO_z$ layer (1 at. %<y<10 at. %) described above, during use of an HfSi compound target, the target should therefore have a silicon content between 0.5 wt % and 5 wt %. For a preferred Si content y of the $Hf_xSi_yO_{66.7}$ layer (1 at. %<y<7 at. %), during use of an HfSi compound target, the target should have a silicon content between 0.5 wt % and 4 wt %. FIG. 8 shows measured values of the refractive index n and the extinction k of a $Hf_xSi_yO_{66.66}$ layer and a $ZrO_2$ layer as a function of wavelength. As is apparent, a reduction of the optical losses in the UV range in $Zr_xSi_yO_z$ is even more pronounced than in $Hf_xSi_yO_z$ i.e., in pure $ZrO_2$, the extinction reaches a value of 1E-3, already at a wavelength of 330 nm, whereas in $Hf_{30.83}Si_{2.5}O_{66.66}$, this value is only reached at 280 nm. In this composition, coating at a high rate of about 0.5 m/s can be accomplished, whereas in a coating with $ZrO_2$, only half that rate was achieved. As in $Hf_xSi_yO_{66.7}$, the stress is also reduced in the corresponding zirconium compound by about the same factor relative to the pure metal oxide.

A layer with stoichiometric or almost stoichiometric composition ($Zr_{30.83}Si_{2.5}O_{66.66}$) is preferably produced or used, which offers optimal optical and mechanical properties, i.e., low optical losses into the UV spectral range, high refractive index>2.1 and low stress<100 MPa.

Figure 1B:
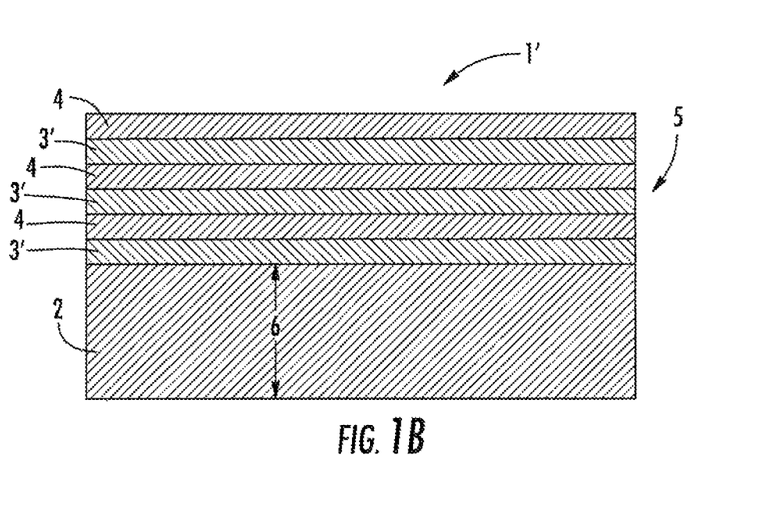
FIG. 1b shows a schematic view of a substrate with a multilayer system.

FIG. 1b shows an optical component 1', an edge filter, which is provided with an integrated reflection reduction layer or antireflection layer to increase its light transparency. Edge filters allow light to pass through almost unfiltered up to a limit frequency, but block most of the light from the limit frequency. A multilayer system 5 with several superimposed layers 3', 4 from dielectric materials with different refractive indices are used as coating, in which layers 3' from a high refractive material and layers 4 from a relatively low refractive material are arranged superimposed in alternation. The multilayer system typically consists of 10-100 individual layers 3', 4, in which the individual layers 3', 4 typically have a thickness from 20 to 100 nm. In the present practical example, the substrate 2 consists of a thin plate of quartz or plastic. The thickness 6 of the substrate is between 0.5 and 1.0 mm; the magnitude of the multilayer thickness 5 in FIG. 1b is therefore shown strongly exaggerated relative to the thickness 6 of substrate 2. The layers 3', 4 of the multilayer system 5 are applied to the substrate 2 by a sputtering method and, depending on the size of the internal stresses in the individual layers, exert forces on substrate 2. The forces of the individual layers are added, so that in a complex multilayer system 5 with internal stresses of >1 GPa, very high forces can act on the substrate 2. In order to avoid deformation of substrate 2 because of such layer stresses, the internal stresses of the individual layers 3', 4 must therefore be as low as possible. This is achieved in the present practical example in that the layers 3' with high refractive index consist of $Hf_xSi_yO_{66.7}$, the silicon content y preferably lying between 1.5 at. % and 3 at. %. With corresponding adjustment of the sputtering parameters, such sputtering layers, as described above, have low internal stress with high refractive index and high transparency. The individual layers 4 with low refractive index can consist of $SiO_2$, which has a refractive index of about n=1.48 at 550 nm.

The $Hf_xSi_yO_z$ and $Zr_xSi_yO_z$ coatings according to the invention are particularly suited for use of laser-resistant optical components with low residual reflection and high transparency for UV light from a wavelength range up to 230 nm, for example, for optical components that are used in laser optics in microlithography systems to produce microelectronic components (for example, for use in laser optics for KrF excimer lasers with a working wavelength of X=248 nm). The $Hf_xSi_yO_z$ and $Zr_xSi_yO_z$ coatings according to the invention are also suited for use in mirrors, especially laser mirrors and edge filters, and also for interference filters into the UV range. The coating, in particular, can be used as an antireflection coating on semiconductor lasers.

The invention claimed is:
1. Coating comprising a composition having the formula $Hf_xSi_yO_z$ or $Zr_xSi_yO_z$, wherein x=100−(y+z) at. %, y=1.5 at. % to 3 at. %, and z=65 at. % to 68 at. %; wherein the formula $Hf_xSi_yO_z$ represents $HfO_2$ with part of the hafnium replaced by silicon; and wherein the formula $Zr_xSi_yO_z$ represents $ZrO_2$ with part of the zirconium replaced by silicon.

2. Coating according to claim 1, wherein z=66.7 at. % in the formula $Hf_xSi_yO_z$ or z=66.66 at. % in the formula $Zr_xSi_yO_z$.

3. Coating according to claim 2, wherein the composition has the formula $Zr_{30.83}Si_{2.5}O_{66.66}$.

4. Method of production of coating according to claim 1, wherein the coating is produced by magnetron sputtering.

5. Method according to claim 4, wherein the coating is produced by reactive co-magnetron sputtering of Hf or Zr and Si.

6. Method according to claim 4, wherein the coating is produced by reactive co-magnetron sputtering of HfSi or ZrSi and Si.

7. Method according to claim 4, wherein the coating is produced by reactive co-magnetron sputtering of $Hf_xSi_yO_z$ or $Zr_xSi_yO_z$ and Si.

8. Method according to claim 4, wherein the coating is produced by reactive magnetron sputtering using an Hf- or Zr- and Si-containing compound target.

9. Method according to claim 4, wherein the coating is produced by partially reactive magnetron sputtering using a conducting $Hf_xSi_yO_z$ or $Zr_xSi_yO_z$ compound target.

10. Method according to claim 4, wherein the magnetron sputtering is accompanied by reactive in situ plasma treatment.

11. Method according to claim 4, wherein the Si fraction is set so that the coating has minimal extinction with simultaneously low internal layer stress and high refractive index.

* * * * *